(12) United States Patent
Tanaka (10) Patent No.: US 8,791,431 B2
(45) Date of Patent: Jul. 29, 2014

(54) DRAWING APPARATUS, AND METHOD OF MANUFACTURING ARTICLE

(71) Applicant: Canon Kabushiki Kaisha, Tokyo (JP)

(72) Inventor: Ichiro Tanaka, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 14/106,027

(22) Filed: Dec. 13, 2013

(65) Prior Publication Data

US 2014/0168628 A1  Jun. 19, 2014

(30) Foreign Application Priority Data

Dec. 19, 2012  (JP) ................................ 2012-277440
Sep. 24, 2013  (JP) ................................ 2013-197508

(51) Int. Cl.
*H01J 37/305* (2006.01)
*H01J 37/08* (2006.01)
*G21G 5/00* (2006.01)
*G21G 7/00* (2009.01)

(52) U.S. Cl.
USPC .............. 250/492.2; 250/492.22; 204/157.44; 204/157.47; 204/157.63; 422/186

(58) Field of Classification Search
USPC .......... 250/396 R, 398, 491.1, 492.2, 492.21, 250/492.22, 492.3; 204/157.44, 157.47, 204/157.63; 422/186, 186.05, 186.06, 422/186.07
See application file for complete search history.

(56) References Cited

U.S. PATENT DOCUMENTS

| | | | | |
|---|---|---|---|---|
| 6,207,117 | B1 * | 3/2001 | Takamatsu et al. | 422/186 |
| 8,497,476 | B2 * | 7/2013 | Hatakeyama et al. | 250/310 |
| 2001/0051317 | A1 * | 12/2001 | Nakano | 430/296 |
| 2012/0183905 | A1 * | 7/2012 | Terashima et al. | 430/296 |
| 2012/0235036 | A1 * | 9/2012 | Hatakeyama et al. | 250/310 |
| 2013/0040240 | A1 * | 2/2013 | Terashima | 430/296 |
| 2013/0273478 | A1 * | 10/2013 | Sano et al. | 430/325 |
| 2014/0014848 | A1 * | 1/2014 | Hatakeyama et al. | 250/393 |
| 2014/0065549 | A1 * | 3/2014 | Nakayama et al. | 430/296 |

FOREIGN PATENT DOCUMENTS

| | | | |
|---|---|---|---|
| JP | 2011-086885 A | | 4/2011 |
| JP | 2011-086886 A | | 4/2011 |
| JP | 2013-182945 A | * | 9/2013 |

* cited by examiner

*Primary Examiner* — Bernard E Souw
(74) *Attorney, Agent, or Firm* — Rossi, Kimms & McDowell LLP (57) ABSTRACT

The present invention provides a drawing apparatus for performing drawing on a substrate with a charged particle beam, the apparatus including a first member in which an aperture, through which the charged particle beam passes, is formed, a chamber including a first space and a second space which are partitioned by the first member, and a removing device including a first supply device configured to supply a first gas containing unsaturated hydrocarbon to the first space and a second supply device configured to supply a second gas containing ozone to the second space, and configured to remove contamination on the first member by active species generated by reaction of the first gas with the second gas.

16 Claims, 7 Drawing Sheets

DRAWING APPARATUS, AND METHOD OF MANUFACTURING ARTICLE

BACKGROUND OF THE INVENTION

1. Field of the Invention

The present invention relates to a drawing apparatus, and a method of manufacturing an article.

2. Description of the Related Art

Along with the higher integration and miniaturization of semiconductor devices, a drawing apparatus using a charged particle beam (electron beam) and an EUV exposure apparatus using EUV (extreme ultraviolet) rays have been developed as a lithography apparatus of the next generation, which forms (transfers) a pattern on a substrate.

For example, in the EUV exposure apparatus, a technique of removing contaminations such as carbon films deposited on a mirror (reflective optical member) has been proposed by Japanese Patent Laid-Open Nos. 2011-86885 and 2011-86886. With the technique of Japanese Patent Laid-Open Nos. 2011-86885 and 2011-86886, active species (ozonide) are generated by mixing unsaturated hydrocarbon and ozone, and contaminations are removed by such active species.

In the drawing apparatus as well, contaminations are deposited on a member having an aperture through which charged particle beam passes (for example, an electrostatic lens or aperture) due to outgases emitted from a substrate and a resist applied on the substrate, and secondary electrons generated when a charged particle beam strikes the substrate. Especially, the contamination deposited in the vicinity of the aperture of such member influences an orbit of the charged particle beam which passes through the aperture when it is charged (that is, the charged particle beam is deviated from a target orbit). Since the contamination is deposited, the aperture size of the electrostatic lens or aperture is reduced, and an intensity (current) of the charged particle beam which passes through the aperture is decreased, resulting in a throughput drop. Alternatively, since the contamination is deposited, the roundness of the aperture of the electrostatic lens is changed, thus generating aberrations.

Hence, the technique of Japanese Patent Laid-Open Nos. 2011-86885 and 2011-86886 may be applied to a drawing apparatus. However, when active species are separated away from positions where they are generated by reaction between unsaturated hydrocarbon and ozone, they are abruptly deactivated (contamination removing efficiency lowers). Therefore, contaminations deposited in the vicinity of the aperture of the electrostatic lens or aperture cannot be sufficiently removed.

SUMMARY OF THE INVENTION

The present invention provides, for example, a drawing apparatus advantageous to removal of contamination on a member on which a charged particle impinges.

According to one aspect of the present invention, there is provided a drawing apparatus for performing drawing on a substrate with a charged particle beam, the apparatus including a first member in which an aperture, through which the charged particle beam passes, is formed, a chamber including a first space and a second space which are partitioned by the first member, and a removing device including a first supply device configured to supply a first gas containing unsaturated hydrocarbon to the first space and a second supply device configured to supply a second gas containing ozone to the second space, and configured to remove contamination on the first member by active species generated by reaction of the first gas with the second gas.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

First Embodiment

Figure 1:
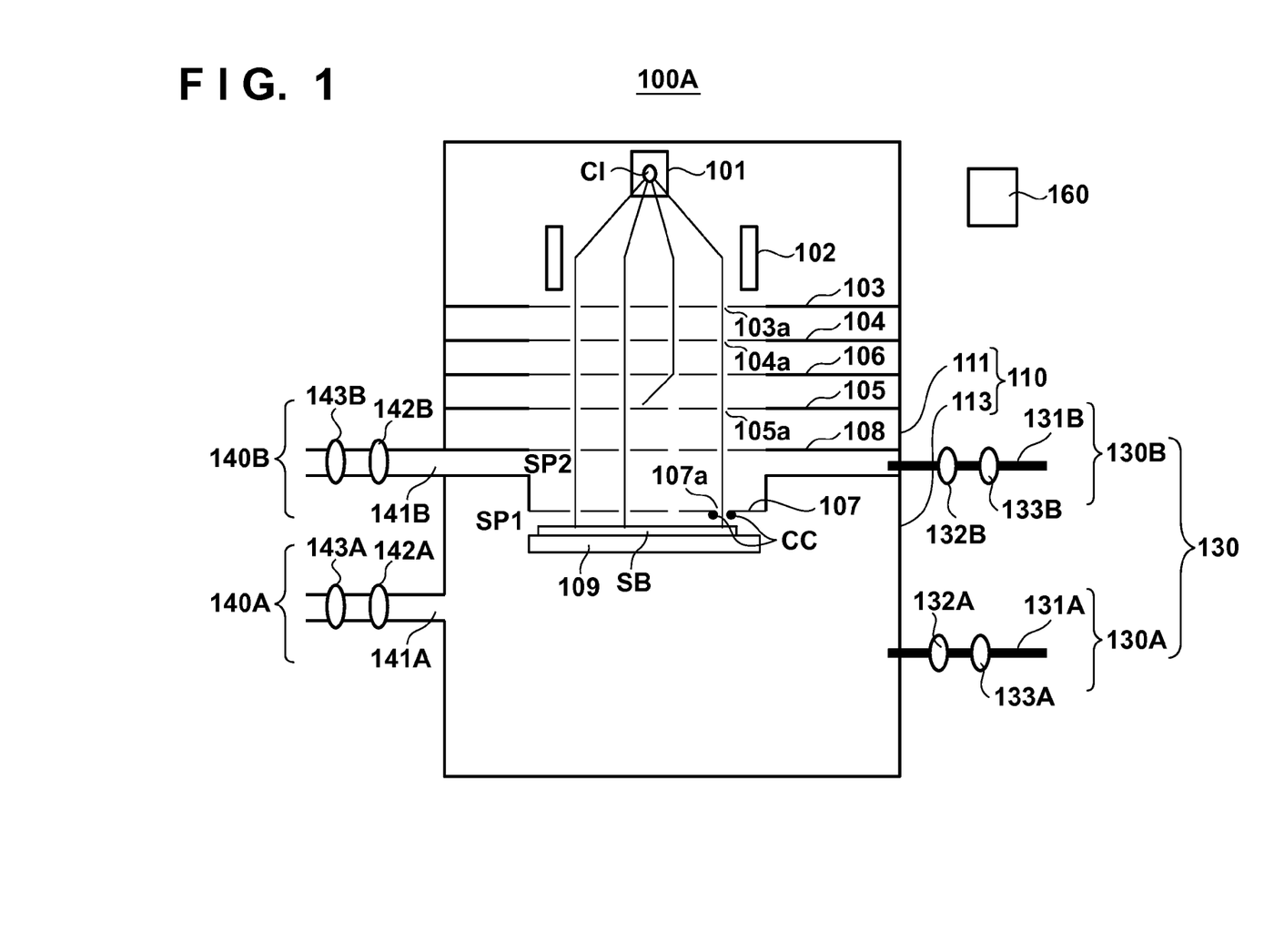
FIG. 1 is a schematic view showing the arrangement of a drawing apparatus according to the first embodiment of the present invention.

FIG. 1 is a schematic view showing the arrangement of a drawing apparatus 100A according to the first embodiment of the present invention. A drawing apparatus 100A is a lithography apparatus which performs drawing on a substrate using a charged particle beam (electron beam), that is, which draws a pattern on a substrate using a charged particle beam.

The drawing apparatus 100A includes a charged particle source 101, collimator lens 102, aperture array 103, electrostatic lens array 104, stopping aperture array 105, blanker array 106, and electrostatic lens array 107. Also, the drawing apparatus 100A includes a deflector 108, stage (movable object) 109, chamber 110, removing mechanism 130, first adjustment unit (regulator) 140A, second adjustment unit (regulator) 140B, and control unit (controller) 160. The control unit 160 includes, for example, a CPU, memory, and the like, and controls the respective units (operations) of the drawing apparatus 100A.

The charged particle source 101, collimator lens 102, aperture array 103, electrostatic lens array 104, stopping aperture array 105, blanker array 106, electrostatic lens array 107, and deflector 108 configure a charged particle optical system. The charged particle optical system guides a charged particle beam to a substrate SB.

The charged particle source 101 has a function of generating a charged particle beam, and forms a crossover image CI.

A charged particle beam diffused from the crossover image CI is nearly collimated by the collimator lens 102, and enters the aperture array 103.

On the aperture array (aperture array member) 103, a plurality of apertures (for example, circular apertures) 103a through which the charged particle beam passes are formed in a matrix. The charged particle beam which enters the aperture array 103 is divided into a plurality of charged particle beams by the plurality of apertures 103a of the aperture array 103.

The charged particle beams which have passed through the aperture array 103 enter the electrostatic lens array 104 having circular apertures 104a through which the charged particle beams pass. The electrostatic lens array 104 is generally configured by three electrode plates (electrode members), and FIG. 1 integrally illustrates the three electrode plates.

At positions where the charged particle beams, which have passed through the electrostatic lens array 104, form crossover images first, the stopping aperture array 105 having small apertures 105a, which are arranged in a matrix, is disposed. A blanking operation for shielding the charged particle beams (those which travel toward the substrate SB) in the stopping aperture array 105 is performed by the blanker array (aperture member) 106.

The charged particle beams which have passed through the stopping aperture array 105 are imaged by the electrostatic lens array 107, and form crossover images on the substrate SB such as a wafer or mask. The electrostatic lens array 107 has circular apertures 107a through which the charged particle beams pass, and is configured by three electrode plates (electrode members) in the same manner as the electrostatic lens array 104.

Upon drawing a pattern, the crossover images on the substrate SB are deflected in a Y-axis direction by the deflector 108, and the blanking operation is performed by the blanker array 106 while continuously moving the stage 109, which holds the substrate SB, in an X-axis direction. In this case, the crossover images are deflected (scanned) by the deflector 108 with reference to a length measurement result of the stage 109 in real time by a laser length measuring device.

Since the charged particle beams are abruptly attenuated in an atmospheric environment, the drawing apparatus 100A, that is, the charged particle source 101 to the stage 109 are housed in the chamber 110, so as to prevent discharging caused by a high voltage. The interior of the chamber 110 is maintained in a vacuum atmosphere, for example, a pressure of $10^{-5}$ Pa or less.

Since a space where the charged particle optical system is disposed is required to have a high degree of vacuum, it may have an exhaust system independently of a space where the stage 109 from which many gases are generated. In this embodiment, the charged particle source 101 to the deflector 108, which configure the charged particle optical system, are housed in an optical system chamber 111 having an exhaust pipe 141B, and the stage 109 is housed in a stage chamber 113 having an exhaust pipe 141A.

The electrostatic lens array 107 includes charged particle lenses disposed on the side closest to the substrate in the charged particle optical system, and faces the substrate SB as a drawing target. The electrostatic lens array 107 is a member (first member) which partitions the interior of the chamber 110 into a first space SP1 and second space SP2. On the electrostatic lens array 107, especially, on an electrode plate on the side closest to the substrate of the three electrode plates which configure the electrostatic lens array 107, contaminations CC such as carbon films (contamination films) are deposited as the drawing is repeated.

The reason why contaminations CC are deposited on the electrostatic lens array 107 will be described below. When the substrate SB is irradiated with the charged particle beams, secondary electrons are generated from the substrate SB, and an organic gas containing carbon is generated from a resist applied on the substrate SB. When the electrostatic lens array 107 is irradiated with the secondary electrons generated by the substrate SB while the organic gas exists in the vicinity of the electrostatic lens array 107, the organic gas is decomposed, thus depositing contaminations CC containing carbon as a principal component on the electrostatic lens array 107.

When contaminations CC deposited on the electrostatic lens array 107 increase, since they clog the apertures 107a of the electrostatic lens array 107 to influence orbits of the charged particle beams which pass through the apertures 107a, the charged particle beams which pass through the apertures 107a are deviated from the target orbits. When contaminations CC are deposited, the aperture size of the electrostatic lens array 107 is reduced, and the intensities (currents) of the charged particle beams which pass through the apertures 107a are decreased, resulting in a throughput drop. Furthermore, due to deposition of contaminations CC, the roundness of each aperture 107a of the electrostatic lens array 107 is changed, thus generating aberrations. In this manner, when contaminations CC are deposited on the electrostatic lens array 107, they disturb normal drawing processing.

Hence, the drawing apparatus 100A includes the removing mechanism 130, which removes contaminations CC deposited on a region including the apertures 107a of the electrostatic lens array 107 by active species (ozonide) generated by reaction between a gas (first gas) containing unsaturated hydrocarbon and a gas (second gas) containing ozone.

In this embodiment, the removing mechanism 130 includes a first supply unit 130A which supplies an ethylene gas (gas containing unsaturated hydrocarbon) to the first space SP1, and a second supply unit 130B which supplies an ozone gas (gas containing ozone) to the second space SP2. The first supply unit 130A includes, as a mechanism required to supply the ethylene gas to the first space SP1, a pipe 131A connected to an ethylene generator and the stage chamber 113, and a stop valve 132A and flow rate controller 133A, which are connected to the pipe 131A. The second supply unit 130B includes, as a mechanism required to supply the ozone gas to the second space SP2, a pipe 131B connected to an ozone generator and the optical system chamber 111, and a stop valve 132B and flow rate controller 133B, which are connected to the pipe 131B.

The exhaust pipe 141A of the stage chamber 113 is connected to an exhaust pump (not shown) via a stop valve 142A and variable conductance valve 143A. The exhaust pipe 141A, stop valve 142A, variable conductance valve 143A, and exhaust pump configure the first adjustment unit 140A, which adjusts (regulates) the pressure of the first space SP1 by evacuating the first space SP1, under the control of the control unit 160.

Likewise, the exhaust pipe 141B of the optical system chamber 111 is connected to an exhaust pump (not shown) via a stop valve 142B and variable conductance valve 143B. The exhaust pipe 141B, stop valve 142B, variable conductance valve 143B, and exhaust pump configure the second adjustment unit 140B, which adjusts (regulates) the pressure of the second space SP2 by evacuating the second space SP2, under the control of the control unit 160.

The first and second adjustment units 140A and 140B configure an adjustment unit which adjusts a pressure of at least one of the first or second spaces SP1 and SP2.

Removing processing for removing contaminations CC deposited on the electrostatic lens array 107 in the drawing apparatus 100A will be described below. This removing processing is implemented when the control unit 160 systematically controls the respective units of the drawing apparatus 100A.

Initially, the control unit 160 stops generation of a charged particle beam in the charged particle source 101. Normally, upon drawing a pattern on the substrate SB, since the stop valves 142A and 142B are in an open state, the control unit 160 maintains that state.

Next, the control unit 160 supplies the ethylene gas to the first space SP1 and the ozone gas to the second space SP2 while setting the stop valves 132A and 132B in an open state. In this case, the control unit 160 controls the flow rates of the ethylene gas and ozone gas to, for example, 100 sccm respectively via the flow rate controllers 133A and 133B. Also, the control unit 160 controls (adjusts) the variable conductance valves 143A and 143B (first and second adjustment units 140A and 140B), so that a pressure P1 in the first space SP1 and a pressure P2 in the second space SP2 become, for example, 100 Pa.

Thus, the ethylene gas supplied to the first space SP1 and the ozone gas supplied to the second space SP2 react each other in the vicinity of the apertures 107a of the electrostatic lens array 107, that is, in the vicinity of locations where contaminations CC are deposited, thus generating active species. The active species generated in the vicinity of the apertures 107a of the electrostatic lens array 107 remove contaminations CC by acting on contaminations CC deposited on the electrostatic lens array 107.

Most of active species are deactivated while they are diffused over a distance of several cm from their generated (reacting) locations due to their unstable state, and are transformed into a substance in a stable state. In this embodiment, since the active species are generated in the vicinity of the apertures 107a of the electrostatic lens array 107, the concentration of the active species at the locations where contaminations CC are deposited is highest, thus efficiently removing contaminations CC. More specifically, in this embodiment, contaminations CC deposited on the electrostatic lens array 107 can be removed at a removing rate of 100 nm/min. Since the concentration of the active species immediately lowers at positions separated away from the vicinities of the apertures 107a of the electrostatic lens array 107, deteriorations (damages) on other members by the active species can be minimized.

As described above, according to the drawing apparatus 100A of this embodiment, active species can be generated in the vicinity of the apertures 107a of the electrostatic lens array 107 where contaminations CC are deposited. Therefore, the drawing apparatus 100A can quickly remove contaminations CC deposited on the electrostatic lens array 107, and can execute normal drawing processing while suppressing throughput and performance drops.

This embodiment has exemplified the electrostatic lens array 107 as a member which includes apertures through which charged particle beams pass and on which contaminations CC are deposited. However, the present invention is not limited to this. For example, contaminations CC are deposited on the aperture array 103, electrostatic lens array 104, stopping aperture array 105, and the like. For each of such members, a gas containing unsaturated hydrocarbon and that containing ozone are respectively supplied to spaces which sandwich the apertures, thereby generating the active species in the vicinity of the apertures, and removing contaminations CC.

In this embodiment, the pressure P1 of the first space SP1 and the pressure P2 of the second space SP2 are set at 100 Pa. Alternatively, the first and second adjustment units 140A and 140B may be controlled to form a pressure difference between the first and second spaces SP1 and SP2. For example, the first and second adjustment units 140A and 140B are controlled so that the pressure (one pressure) P2 of the second space SP2 is higher than the pressure (the other pressure) P1 of the first space SP1. More specifically, the first and second adjustment units 140A and 140B are controlled, so that the pressure P1 of the first space SP1 is 100 Pa, and the pressure P2 of the second space SP2 is 110 Pa. Then, reaction locations (that is, locations where active species are generated) of the ethylene gas and ozone gas are shifted to the first space side, thereby further efficiently removing contaminations CC mainly deposited on the first space side of the electrostatic lens array 107.

It is also effective to control the pressure difference between the first and second spaces SP1 and SP2, so that locations where the active species are generated are changed along with an elapse of time. For example, while the pressure P1 of the first space SP1 is maintained at 100 Pa, operations for maintaining the pressure P2 at 110 Pa for 3 min, and then maintaining the pressure P2 at 95 Pa for 0.5 min are repeated. In other words, the first and second adjustment units 140A and 140B are controlled so that the magnitude relation between the pressure P1 of the first space SP1 and the pressure P2 of the second space SP2 is inverted along with an elapse of time. In this manner, contaminations CC deposited on the apertures 107a of the electrostatic lens array 107 can be efficiently removed while removing contaminations CC deposited on the first space side of the electrostatic lens array 107 at a high removing rate. In this case, only the pressure P2 of the second space SP2 is changed. Alternatively, both the pressures P1 and P2, or only the pressure P1 may be changed as long the relative magnitude relation between the pressure P1 of the first space SP1 and the pressure P2 of the second space SP2 remains the same.

Second Embodiment

Figure 2:
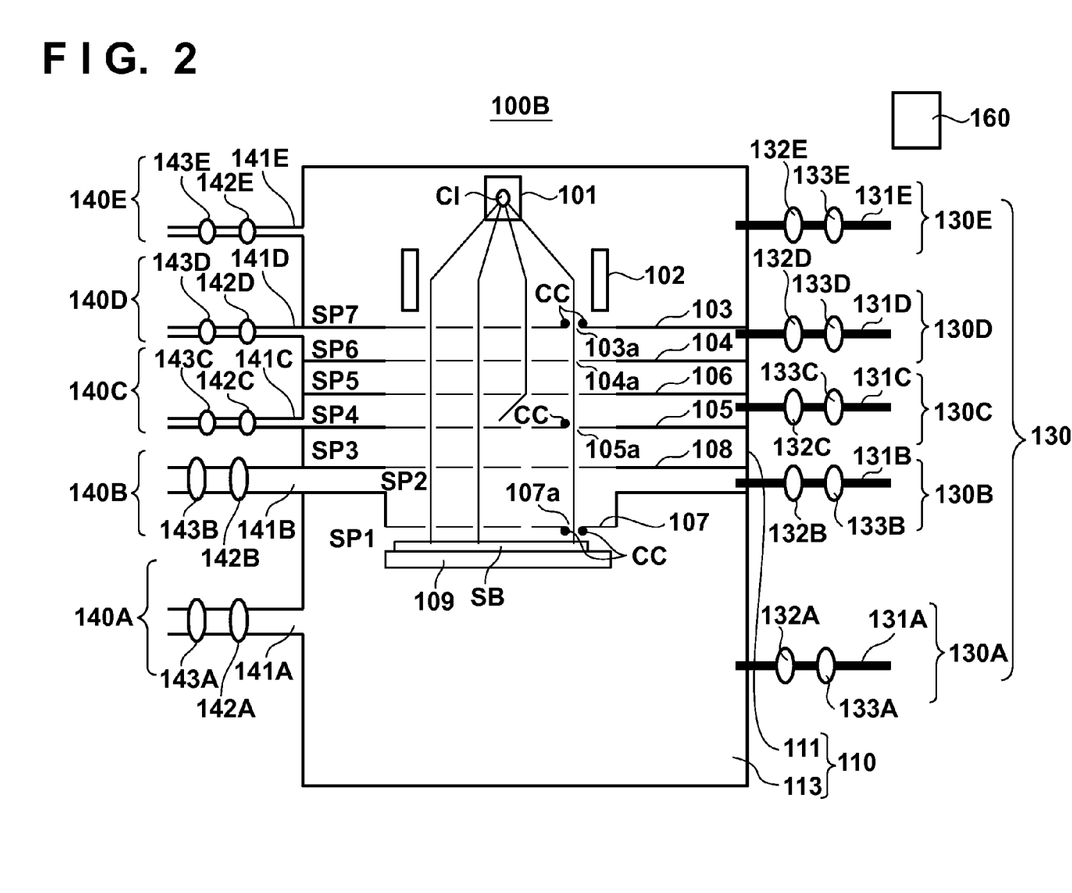
FIG. 2 is a schematic view showing the arrangement of a drawing apparatus according to the second embodiment of the present invention.

FIG. 2 is a schematic view showing the arrangement of a drawing apparatus 100B according to the second embodiment of the present invention. A drawing apparatus 100B has the same arrangement as the drawing apparatus 100A. In this embodiment, a deflector 108 functions as a member for partitioning the interior of a chamber 110 into second and third spaces SP2 and SP3. A stopping aperture array 105 functions as a member for partitioning the interior of the chamber 110 into the third space SP3 and a fourth space SP4. A blanker array 106 functions as a member for partitioning the interior of the chamber 110 into the fourth space SP4 and a fifth space SP5. An electrostatic lens array 104 functions as a member (second member) for partitioning the interior of the chamber 110 into the fifth space SP5 and a sixth space SP6. An aperture array 103 functions as a member (third member) for partitioning the interior of the chamber 110 into the sixth space SP6 and a seventh space SP7.

The drawing apparatus 100B further includes a third supply unit 130C required to supply an ethylene gas to the fourth space SP4, a fourth supply unit 130D required to supply an ethylene gas to the sixth space SP6, and a fifth supply unit 130E required to supply an ozone gas to the seventh space SP7. The third supply unit 130C includes, as a mechanism required to supply an ethylene gas to the fourth space SP4, a pipe 131C connected to an ethylene generator and the optical system chamber 111, and a stop valve 132C and flow rate controller 133C connected to the pipe 131C. The fourth supply unit 130D includes, as a mechanism required to supply an ethylene gas to the sixth space SP6, a pipe 131D connected to the ethylene generator and optical system chamber 111, and a stop valve 132D and flow rate controller 133D connected to the pipe 131D. The fifth supply unit 130E includes, as a mechanism required to supply an ozone gas to the seventh space SP7, a pipe 131E connected to an ozone generator and the optical system chamber 111, and a stop valve 132E and flow rate controller 133E connected to the pipe 131E.

Also, the drawing apparatus 100B further includes a third adjustment unit 140C, fourth adjustment unit 140D, and fifth adjustment unit 140E. The third adjustment unit 140C includes an exhaust pipe 141C, stop valve 142C, variable conductance valve 143C, and exhaust pump (not shown), and adjusts a pressure P4 of the fourth space SP4 by evacuating the fourth space SP4 under the control of a control unit 160. The fourth adjustment unit 140D includes an exhaust pipe 141D, stop valve 142D, variable conductance valve 143D, and exhaust pump (not shown), and adjusts a pressure P6 of the sixth space SP6 by evacuating the sixth space SP6 under the control of the control unit 160. The fifth adjustment unit 140E includes an exhaust pipe 141E, stop valve 142E, variable conductance valve 143E, and exhaust pump (not shown), and adjusts a pressure P7 of the seventh space SP7 by evacuating the seventh space SP7 under the control of the control unit 160.

As described also in the first embodiment, contaminations CC are deposited not only on an electrostatic lens array 107 but also on the aperture array 103 and stopping aperture array 105. This is because the aperture array 103 and stopping aperture array 105 are irradiated with a charged particle beam from a charged particle source 101. Therefore, contaminations CC are readily deposited on a region (especially, on the charged particle source side) including apertures 103a of the aperture array 103 and that (especially, on the charged particle source side) including apertures 105a of the stopping aperture array 105.

Hence, in this embodiment, a removing mechanism 130 supplies an ethylene gas (gas containing unsaturated hydrocarbon) to the first, fourth, and sixth spaces SP1, SP4, and SP6, and an ozone gas (gas containing ozone) to the second and seventh spaces SP2 and SP7. Then, the ethylene gas and ozone gas react each other to generate active species (ozonide), thus removing contaminations CC deposited on the aperture array 103, stopping aperture array 105, and electrostatic lens array 107.

Removing processing for removing contaminations CC deposited on the aperture array 103, stopping aperture array 105, and electrostatic lens array 107 in the drawing apparatus 100B will be described below. This removing processing can be implemented when the control unit 160 systematically controls the respective units of the drawing apparatus 100B.

Initially, the control unit 160 stops generation of a charged particle beam by the charged particle source 101. Normally, upon drawing a pattern on a substrate SB, since the stop valves 142A to 142E are in an open state, the control unit 160 maintains that state.

Next, the control unit 160 sets the stop valves 132A to 132E in an open state to supply an ethylene gas to the first, fourth, and sixth spaces SP1, SP4, and SP6, and to supply an ozone gas to the second and seventh spaces SP2 and SP7. In this case, the control unit 160 controls the flow rates of the ethylene gas and ozone gas to, for example, 100 sccm via the flow rate controllers 133A to 133E. Also, the control unit 160 controls (adjusts) the variable conductance valves 143A to 143E (first to fifth adjustment units 140A to 140E), so that the pressures P1, P2, P3, P4, P6, and P7 become, for example, 100 Pa.

Thus, the ethylene gas supplied to the first space SP1 and the ozone gas supplied to the second space SP2 react each other in the vicinity of the apertures 107a of the electrostatic lens array 107, that is, in the vicinity of locations where contaminations CC are deposited, thus generating active species. The active species generated in the vicinity of the apertures 107a of the electrostatic lens array 107 remove contaminations CC by acting on contaminations CC deposited on the electrostatic lens array 107. Also, the ethylene gas supplied to the fourth space SP4 and the ozone gas supplied to the second space SP2 react each other in the vicinity of the apertures 105a of the stopping aperture array 105, that is, in the vicinity of locations where contaminations CC are deposited, thus generating active species. The active species generated in the vicinity of the apertures 105a of the stopping aperture array 105 remove contaminations CC by acting on contaminations CC deposited on the stopping aperture array 105. Likewise, the ethylene gas supplied to the sixth space SP6 and the ozone gas supplied to the seventh space SP7 react each other in the vicinity of the apertures 103a of the aperture array 103, that is, in the vicinity of locations where contaminations CC are deposited, thus generating active species. The active species generated in the vicinity of the apertures 103a of the aperture array 103 remove contaminations CC by acting on contaminations CC deposited on the aperture array 103.

As described above, according to the drawing apparatus 100B of this embodiment, active species can be generated in the vicinity of the apertures 103a of the aperture array 103, the apertures 105a of the stopping aperture array 105, and the apertures 107a of the electrostatic lens array 107 where contaminations CC are deposited. Therefore, the drawing apparatus 100B can quickly remove contaminations CC deposited on the aperture array 103, stopping aperture array 105, and electrostatic lens array 107, and can execute normal drawing processing while suppressing throughput and performance drops.

In this embodiment, the pressures P1, P2, P3, P4, P6, and P7 are set at 100 Pa. Alternatively, the first to fifth adjustment units 140A to 140E may be controlled to form a pressure difference between the respective spaces. For example, the first to fifth adjustment units 140A to 140E are controlled so that the pressures P1 and P4 are 100 Pa, and the pressures P2 and P3 are 110 Pa, the pressure P6 is 100 Pa, and the pressure P7 is 90 Pa. Then, in the vicinity of the apertures 103a of the aperture array 103 and the apertures 105a of the stopping aperture array 105, reaction locations (that is, locations where active species are generated) of the ethylene gas and ozone gas are shifted to the charged particle source side. Therefore, contaminations CC mainly deposited on the charged particle source side of the aperture array 103 and stopping aperture array 105 can be further efficiently removed. Also, in the vicinity of the apertures 107a of the electrostatic lens array 107, reaction locations (that is, locations where active species are generated) of the ethylene gas and ozone gas are shifted to the first space side, thereby further efficiently removing contaminations CC mainly deposited on the first space side of the electrostatic lens array 107.

Third Embodiment

Figure 3:
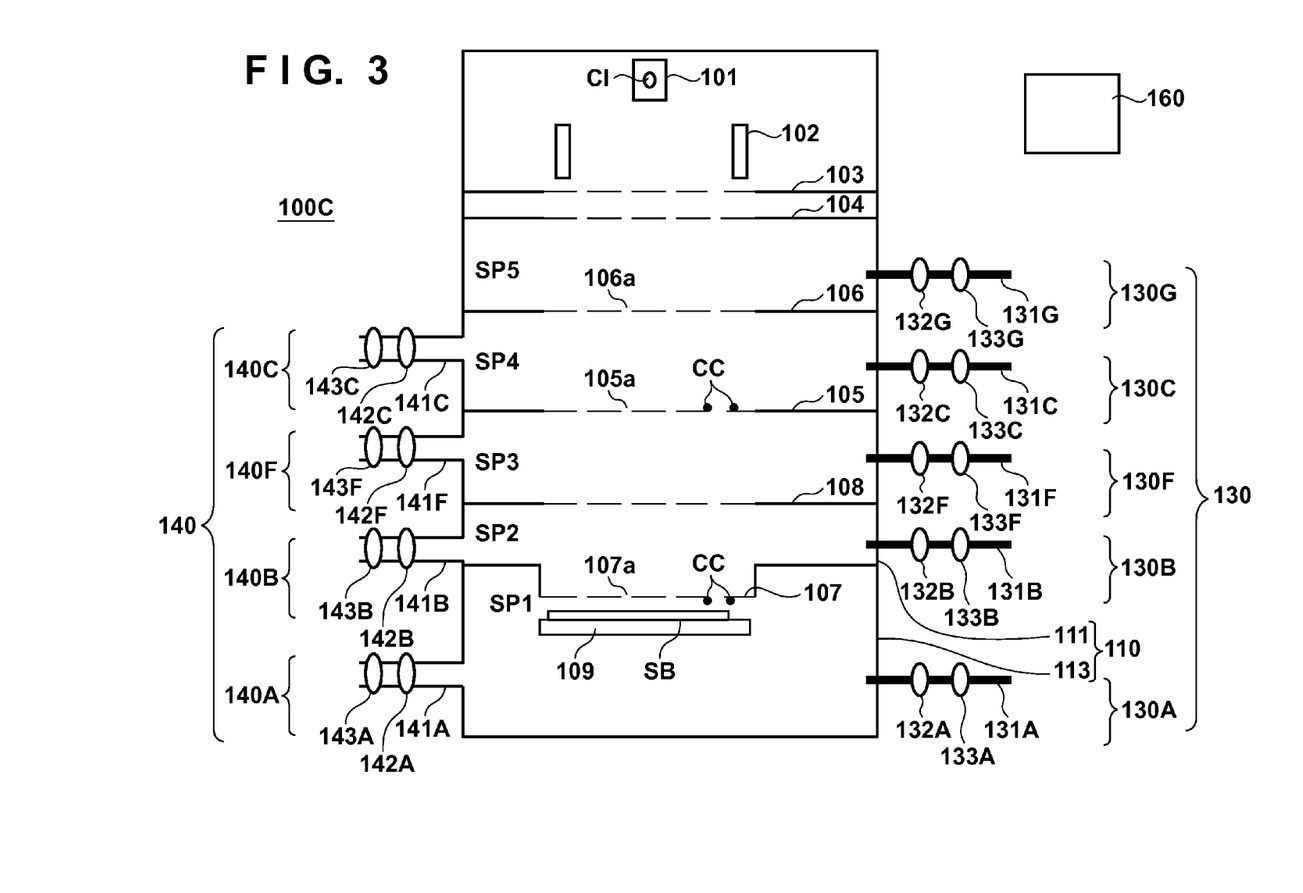
FIG. 3 is a schematic view showing the arrangement of a drawing apparatus according to the third embodiment of the present invention.

FIG. 3 is a schematic view showing the arrangement of a drawing apparatus 100C according to the third embodiment of the present invention. A drawing apparatus 100C has the same arrangement as the drawing apparatus 100A. In this embodiment, a deflector 108 functions as a member for partitioning the interior of a chamber 110 into second and third spaces SP2 and SP3. A stopping aperture array 105 functions as a member for partitioning the interior of the chamber 110 into the third space SP3 and a fourth space SP4. A blanker array 106 functions as a member for partitioning the interior of the chamber 110 into the fourth space SP4 and a fifth space SP5.

The drawing apparatus 100C further includes a sixth supply unit 130F required to supply an ozone gas to the third space SP3, a third supply unit 130C required to supply an ethylene gas to the fourth space SP4, and a seventh supply unit 130G required to supply an ethylene gas to the fifth space SP5. The sixth supply unit 130F includes, as a mechanism required to supply an ozone gas to the third space SP3, a pipe 131F connected to an ozone generator and optical system chamber 111, and a stop valve 132F and flow rate controller 133F connected to the pipe 131F. The third supply unit 130C includes, as a mechanism required to supply an ethylene gas to the fourth space SP4, a pipe 131C connected to an ethylene generator and the optical system chamber 111, and a stop valve 132C and flow rate controller 133C connected to the pipe 131C. The seventh supply unit 130G includes, as a mechanism required to supply an ethylene gas to the fifth space SP5, a pipe 131G connected to the ethylene generator and optical system chamber 111, and a stop valve 132G and flow rate controller 133G connected to the pipe 131G.

Also, the drawing apparatus 100C further includes a third adjustment unit 140C and sixth adjustment unit 140F. The third adjustment unit 140C includes an exhaust pipe 141C, stop valve 142C, variable conductance valve 143C, and exhaust pump (not shown), and adjusts a pressure P4 of the fourth space SP4 by evacuating the fourth space SP4 under the control of a control unit 160. The sixth adjustment unit 140F includes an exhaust pipe 141F, stop valve 142F, variable conductance valve 143F, and exhaust pump (not shown), and adjusts a pressure P3 of the third space SP3 by evacuating the third space SP3 under the control of the control unit 160.

As described also in the second embodiment, contaminations CC are deposited on an electrostatic lens array 107, an aperture array 103, and the stopping aperture array 105. Although depending on design of a charged particle optical system, especially when contaminations CC are deposited on the stopping aperture array 105, the performance of the drawing apparatus is often impaired. Therefore, the drawing apparatus is required to efficiently remove contaminations CC deposited on the stopping aperture array 105.

Hence, in this embodiment, a removing mechanism 130 supplies an ethylene gas (gas containing unsaturated hydrocarbon) to the fourth and fifth spaces SP4 and SP5, and an ozone gas (gas containing ozone) to the third space SP3. Then, the ethylene gas and ozone gas react each other to generate active species (ozonide), thus removing contaminations CC deposited on the stopping aperture array 105. Also, the removing mechanism 130 supplies an ethylene gas to the first space SP1, and an ozone gas to the second space SP2, thus removing contaminations CC deposited on the electrostatic lens array 107 as in the first embodiment.

Removing processing for removing contaminations CC deposited on the stopping aperture array 105 in the drawing apparatus 100C will be described below. This removing processing can be implemented when the control unit 160 systematically controls the respective units of the drawing apparatus 100C.

Initially, the control unit 160 stops generation of a charged particle beam by the charged particle source 101. Normally, upon drawing a pattern on a substrate SB, since the stop valves 142A, 142B, 142C, and 142F are in an open state, the control unit 160 maintains that state.

Next, the control unit 160 sets the stop valves 132A to 132C, 132F, and 132G in an open state to supply an ethylene gas to the first, fourth, and fifth spaces SP1, SP4, and SP5, and to supply an ozone gas to the second and third spaces SP2 and SP3. In this case, the control unit 160 controls the flow rates of the ethylene gas and ozone gas to, for example, 100 sccm via the flow rate controllers 133A to 133C, 133F, and 133G. Also, the control unit 160 controls (adjusts) the variable conductance valves 143A to 143C and 143F, so that the pressures P1, P2, P3, P4, and P5 become, for example, 100 Pa.

After the flow rates of the ethylene gas and ozone gas and the pressures P1 to P5 of the respective spaces reach an equilibrium state, the control unit 160 controls (adjusts) the variable conductance valves 143A to 143C and 143F, so that the pressures P1 to P5 of the respective spaces assume the following values. For example, the control unit 160 controls the variable conductance valves, so that the pressure P1 is 90 Pa, the pressure P2 is 100 Pa, the pressure P3 is 100 Pa, the pressure P4 is 90 Pa, and the pressure P5 is 110 Pa.

Thus, the ethylene gas supplied to the first space SP1 and the ozone gas supplied to the second space SP2 react each other in the vicinity of apertures 107a of the electrostatic lens array 107, that is, in the vicinity of locations where contaminations CC are deposited, thus generating active species. In this case, since the pressure P2 of the second space SP2 is higher than the pressure P1 of the first space SP1, reaction locations (that is, locations where active species are generated) of the ethylene gas and ozone gas are shifted to the first space side. Therefore, contaminations CC mainly deposited on the first space side of the electrostatic lens array 107 can be efficiently removed.

Also, the ethylene gas supplied to the fourth space SP4 and the ozone gas supplied to the third space SP3 react each other in the vicinity of the apertures 105a of the stopping aperture array 105, that is, in the vicinity of locations where contaminations CC are deposited, thus generating active species. In this case, since the pressure P3 of the third space SP3 is higher than the pressure P4 of the fourth space SP4, reaction locations (that is, locations where active species are generated) of the ethylene gas and ozone gas are shifted to the fourth space side. Therefore, contaminations CC mainly deposited on the fourth space side of the stopping aperture array 105 can be efficiently removed.

On the other hand, since active species are deactivated as positions are separated farther away from the reaction locations of the ethylene gas and ozone gas, the concentration of the active species lowers, and a removing rate of contaminations CC often becomes low. In this case, since a time required to remove contaminations CC has to be determined in correspondence with locations where the removing rate is lowest, it is consequently prolonged. In such case, an air current of the reaction locations of the ethylene gas and ozone gas can be disturbed.

In this embodiment, since the pressure P4 of the fourth space SP4 is higher than the pressure P5 of the fifth space SP5, an air current in the vicinity of the reaction locations of the ethylene gas and ozone gas (in the vicinity of apertures 105a of the stopping aperture array 105) is disturbed. More specifically, a flow of the ethylene gas which flows from the fifth space SP5 toward the fourth space SP4 via apertures 160a of the blanker array 106 is generated. As a result, an air current in the vicinity of the apertures 105a of the stopping aperture array 105, that is, in the vicinity of the reaction locations of the ethylene gas and ozone gas is disturbed, thus increasing a removing rate of locations where the removing rate of contaminations CC is lowest. Therefore, the time required to remove contaminations CC can be shortened.

In this embodiment, the ethylene gas is supplied to the fifth space SP5. However, in place of the ethylene gas, an inert gas, for example, a rare gas of argon, helium, neon, or the like, a nitrogen gas, or a gas mixture of them may be supplied. When an inert gas is supplied to the fifth space SP5, the removing rate of contaminations CC can be similarly uniformed.

Also, the ozone gas and ethylene gas may be supplied while being interchanged. More specifically, the ozone gas (gas containing ozone) is supplied to the first space SP1, fourth space SP4, and fifth space SP5, and the ethylene gas (gas containing unsaturated hydrocarbon) is supplied to the second space SP2 and third space SP3, thus obtaining the same effects.

Fourth Embodiment

Figure 4:
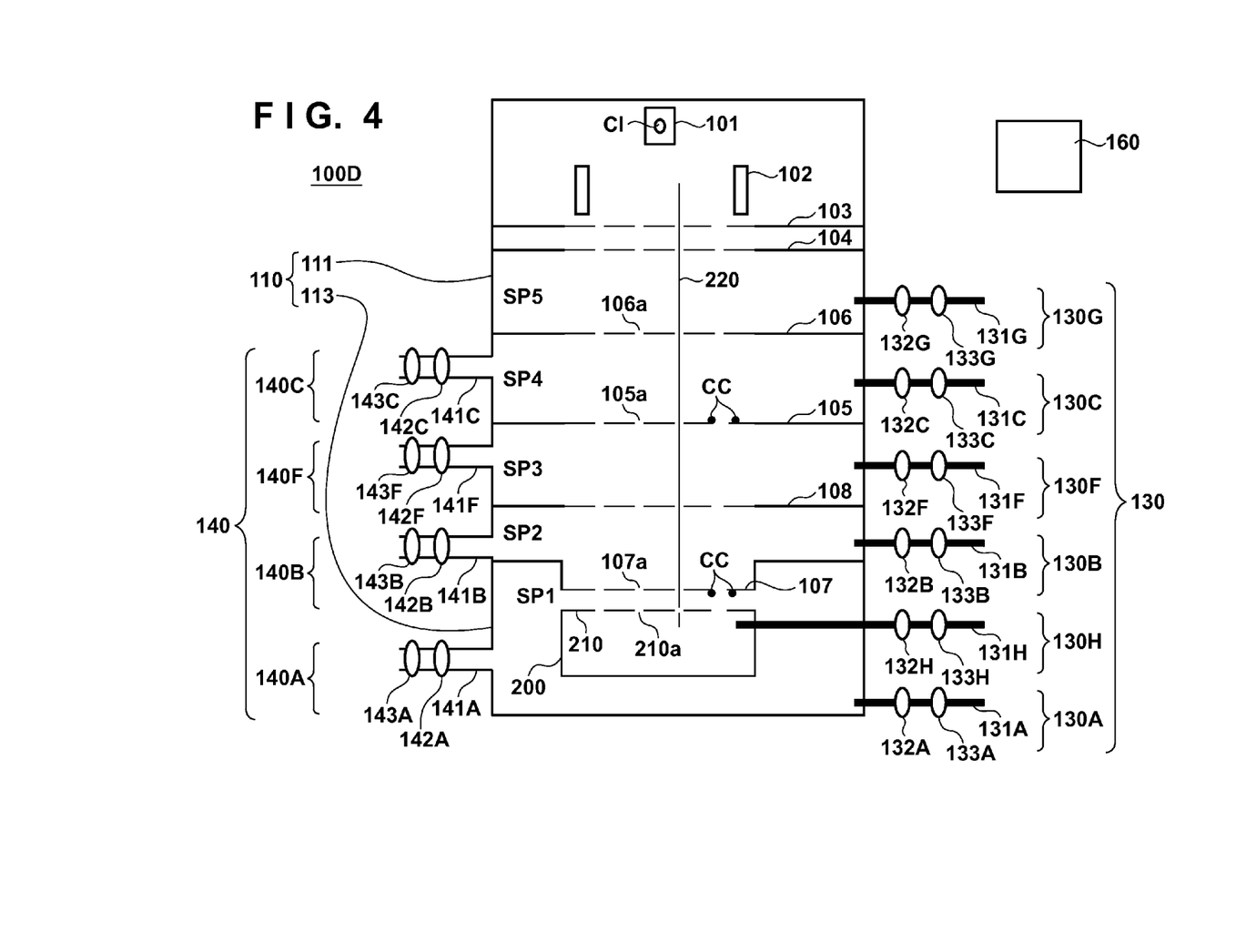
FIG. 4 is a schematic view showing the arrangement of a drawing apparatus according to the fourth embodiment of the present invention.

FIG. 4 is a schematic view showing the arrangement of a drawing apparatus 100D according to the fourth embodiment of the present invention. A drawing apparatus 100D has the same arrangement as the drawing apparatus 100C. In this embodiment, the drawing apparatus 100D further includes a gas supply chamber 200 which can be disposed in the first space SP1.

The gas supply chamber 200 includes a retracting mechanism (not shown). When a pattern is drawn on a substrate SB, the gas supply chamber 200 is retracted from a position below an electrostatic lens array 107. When contaminations CC are removed, the gas supply chamber 200 is disposed below the electrostatic lens array 107. A stage 109 which holds the substrate SB is disposed under the electrostatic lens array 107 (on an orbit of a charged particle beam) when a pattern is drawn on the substrate SB, and is retracted from a position below the electrostatic lens array 107 when contaminations CC are removed. These operations are controlled by a control unit 160.

On the upper surface of the gas supply chamber 200, a gas ejection plate 210 having gas ejection holes 210a is disposed. The gas ejection holes 210a may be formed in the gas ejection plate 210 according to an orbit axis 220 of a charged particle beam. In this case, since a gas can be ejected toward locations where an ozone gas is ejected, that is, toward apertures 107a of the electrostatic lens array 107, an air current in the vicinity of the apertures 107a can be disturbed more efficiently. However, even when the gas ejection holes 210a are not formed according to the orbit axis 220 of a charged particle beam, the effect of disturbing an air current in the vicinity of the apertures 107a can be provided. To the gas supply chamber 200, an eighth supply unit 130H, which supplies an ethylene gas to (the interior of) the gas supply chamber 200 is connected. The eighth supply unit 130H includes, as a mechanism required to supply an ethylene gas to the gas supply chamber 200, a pipe 131H connected to an ethylene generator and the stage chamber 113, and a stop valve 132H and flow rate controller 133H connected to the pipe 131H.

Removing processing for removing contaminations CC in the drawing apparatus 100D is the same as that described in the third embodiment. The third embodiment has explained that contaminations CC deposited on the stopping aperture array 105 can be removed more efficiently. In this embodiment, contaminations CC deposited on the electrostatic lens array 107 can be further removed more efficiently by the gas supply chamber 200 and eighth supply unit 130H.

More specifically, the control unit 160 controls (adjust) the variable conductance valves 143A to 143C and 143F so that the pressures P1 to P5 of the respective spaces assume the following values. For example, the control unit 160 controls the variable conductance valves so that the pressure P1 is 90 Pa, the pressure P2 is 100 Pa, the pressure P3 is 100 Pa, the pressure P4 is 90 Pa, and the pressure P5 is 110 Pa. Furthermore, the control unit 160 controls the eighth supply unit 130H to supply an ethylene gas to the gas supply chamber 200 to maintain the internal pressure of the gas supply chamber 200 to, for example, 110 Pa. In this manner, by setting the pressure of the gas supply chamber 200 to be higher than the pressure P1 of the first space SP1, an air current of the ethylene gas which flow from the gas supply chamber 200 toward the first space SP1 is generated via the gas ejection holes 210a. Thus, an air current in the vicinity of the apertures 107a of the electrostatic lens array 107, that is, in the vicinity of reaction locations of the ethylene gas and ozone gas is disturbed, thus increasing a removing rate of locations where the removing rate of contaminations CC is lowest. Therefore, the time required to remove contaminations CC can be shortened.

In this embodiment, the ethylene gas is supplied to the gas supply chamber 200. However, in place of the ethylene gas, an inert gas, for example, a rare gas of argon, helium, neon, or the like, a nitrogen gas, or a gas mixture of them may be supplied. When an inert gas is supplied to the gas supply chamber 200, the removing rate of contaminations CC can be similarly uniformed.

Also, the ozone gas and ethylene gas may be supplied while being interchanged. More specifically, the ozone gas is supplied to the first space SP1, fourth space SP4, fifth space SP5, and gas supply chamber 200, and the ethylene gas is supplied to the second space SP2 and third space SP3, thus obtaining the same effects.

In place of supplying the ozone gas to the fifth space SP5, an inert gas, for example, a rare gas of argon, helium, neon, or the like, a nitrogen gas, or a gas mixture of them may be supplied. In this case as well, an effect of uniforming a removing rate of contaminations CC deposited on the stopping aperture array 105 can be provided. Even when the fifth space SP5 includes members such as a resin and adhesive, which are readily deteriorated by ozone, deterioration of these members can be prevented. Therefore, the drawing apparatus 100D can be used for a long term.

Fifth Embodiment

Figure 5:
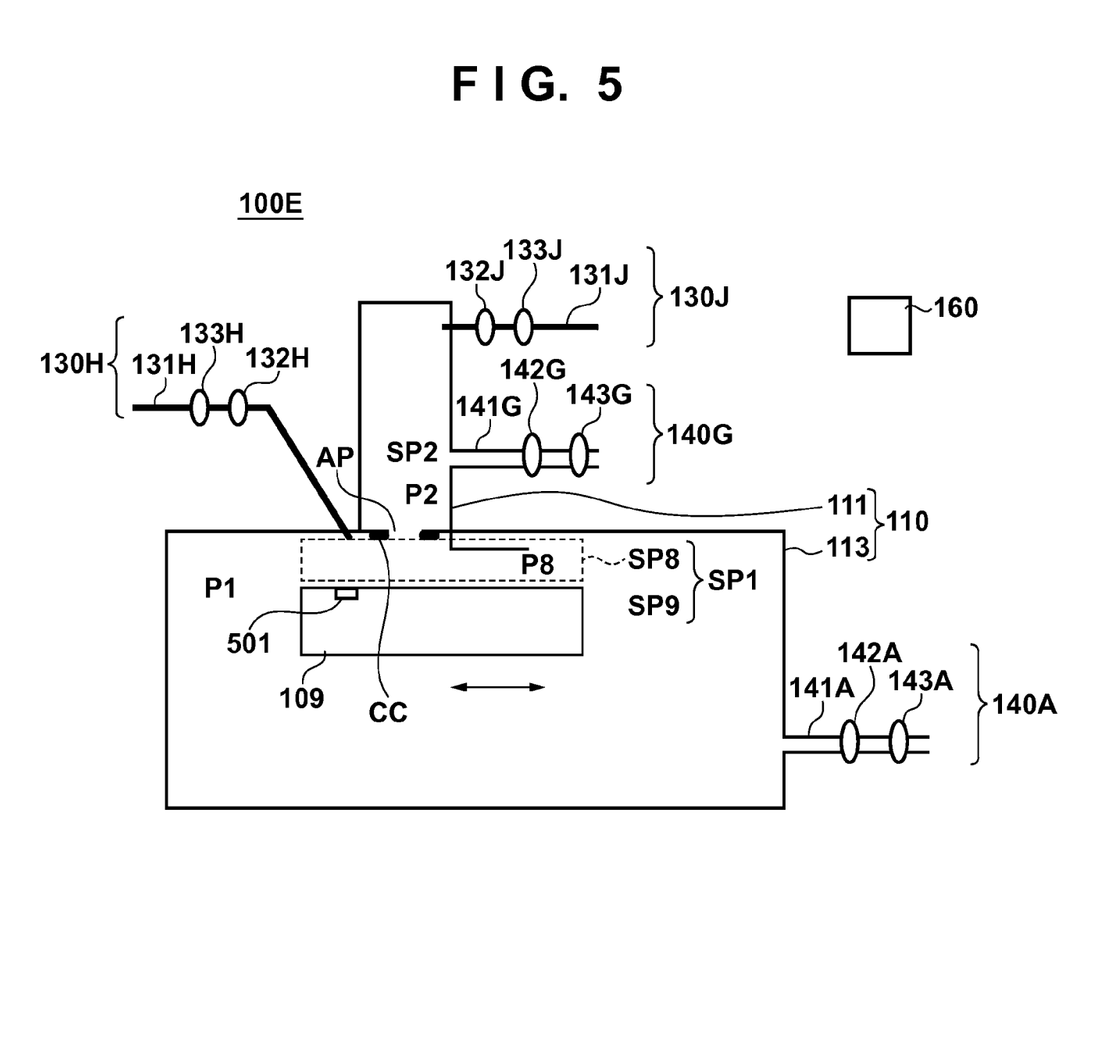
FIG. 5 is a schematic view showing the arrangement of a drawing apparatus according to the fifth embodiment of the present invention.

FIG. 5 is a schematic view showing the arrangement of a drawing apparatus 100E according to the fifth embodiment of the present invention. A drawing apparatus 100E basically has the same arrangement as the drawing apparatus 100A. An optical system chamber 111 houses the same (members which configure) charged particle optical system as in the first embodiment although not shown.

In the drawing apparatus 100E, a charged particle beam from the optical system chamber 111 (charged particle optical system) passes through an aperture AP, and strikes a substrate held by a stage 109. The aperture AP may be apertures 107a of an electrostatic lens array 107 as in the first embodiment, or may be a hole formed in a plate. As described in the first embodiment, contaminations CC are deposited on the aperture AP. The stage 109 is housed in a stage chamber 113, and is configured to be movable inside the stage chamber 113 so as to allow drawing on a substrate and exchange of a substrate.

The aperture AP is a member which partitions the interior of the chamber 110 into first and second spaces SP1 and SP2. The aperture AP has, for example, a diameter ranging from 1 mm to 2 mm. Also, a distance between the stage 109 and aperture AP is, for example, 0.1 mm to 2 mm. However, the size of the aperture AP and the distance between the stage 109 and aperture AP are not limited to them, and the number of apertures AP is not limited to one.

In this embodiment, an eighth space SP8 is defined between the (upper surface of the) stage 109 and the (lower surface of the) stage chamber 113 as a narrow gap space which neighbors the aperture AP. Also, a space of the first space SP1 except for the eighth space SP8 is defined as a ninth space SP9. In other words, the first space SP1 is divided into the eighth and ninth spaces SP8 and SP9, and the eighth space SP8 neighbors the second space SP2 via the aperture AP.

Also, the drawing apparatus 100E further includes a second supply unit 130J required to supply an ethylene gas to the second space SP2, and an eighth supply unit 130H required to supply an ozone gas to the eighth space SP8. The second supply unit 130J includes, as a mechanism required to supply an ethylene gas to the second space SP2, a pipe 131J connected to an ethylene generator and the optical system chamber 111, and a stop valve 132J and flow rate controller 133J, which are connected to the pipe 131J. The eighth supply unit 130H includes, as a mechanism required to supply an ozone gas to the eighth space SP8, a pipe 131H connected to an ozone generator and the eighth space SP8, and a stop valve 132H and flow rate controller 133H, which are connected to the pipe 131H.

Furthermore, the drawing apparatus 100E further includes a first adjustment unit 140A and second adjustment unit 140G. The first adjustment unit 140A includes an exhaust pipe 141A, stop valve 142A, variable conductance valve 143A, and exhaust pump (not shown), and adjusts a pressure P1 of the first space SP1 by evacuating the first space SP1 under the control of a control unit 160. The second adjustment unit 140G includes an exhaust pipe 141G, stop valve 142G, variable conductance valve 143G, and exhaust pump (not shown), and adjusts a pressure P2 of the second space SP2 by evacuating the second space SP2 under the control of the control unit 160.

Removing processing for removing contaminations CC deposited in the vicinity of the aperture AP in the drawing apparatus 100E will be described below. This removing processing is implemented when the control unit 160 systematically controls the respective units of the drawing apparatus 100E.

Initially, the control unit 160 stops generation of a charged particle beam by a charged particle source. Normally, upon drawing a pattern on a substrate SB, since the stop valves 142A and 142G are in an open state, the control unit 160 maintains that state. Also, the control unit 160 moves the stage 109 to a substrate exchange position to pass the substrate, and then moves the stage 109 to a position below the aperture AP.

Next, the control unit 160 sets the stop valves 132H and 132J in an open state to supply an ozone gas to the first space SP1 (eighth space SP8), and to supply an ethylene gas to the second space SP2. In this case, the control unit 160 controls the flow rates of the ozone gas and ethylene gas to, for example, 100 sccm via the flow rate controllers 133H and 133J. Also, the control unit 160 controls (adjusts) the variable conductance valves 143A and 143G, so that the pressure P8 of the eighth space SP8 becomes, for example, 950 Pa, and the pressure P2 of the second space SP2 becomes, for example, 1050 Pa.

Thus, the ethylene gas supplied to the second space SP2 and the ozone gas supplied to the eighth space SP8 react each other in the vicinity of the aperture AP and on the eighth space side, that is, in the vicinity of a location where contaminations CC are deposited, thus generating active species. The active species generated in the vicinity of the aperture AP remove contaminations CC by acting on contaminations CC deposited on the aperture AP.

Most of active species are deactivated while they are diffused over a distance of several cm from their generated (reacting) location due to their unstable state, and are transformed into a substance in a stable state. In this embodiment, since the active species are generated in the vicinity of the aperture AP, the concentration of the active species at the location where contaminations CC are deposited is highest, thus efficiently removing contaminations CC.

The drawing apparatus 100E can also remove contaminations deposited on a sensor 501 used to measure a charged particle beam which strikes the substrate. The sensor 501 measures a focus and shape of a charged particle beam before drawing on the substrate. The sensor 501 is disposed on, for example, the stage 109, and has a structure using a knife edge or fluorescent member. Upon measuring the focus and shape of a charged particle beam, since the sensor 501 is irradiated with the charged particle beam, contaminations are deposited on the sensor 501 as measurements are repeated. When contaminations are deposited on the sensor 501, since the measurement precision of the focus and shape of a charged particle beam lowers, the focus and shape of a charged particle beam cannot be appropriately adjusted, thus disturbing precise drawing. Therefore, in order to maintain the apparatus performance of the drawing apparatus 100E (that is, to execute precise drawing), contaminations deposited on the sensor 501 are required to be removed.

As described above, when contaminations CC deposited on the aperture AP are to be removed, the stage 109 is moved to the position below the aperture AP. In this case, the stage 109 is moved so that the sensor 501 is located immediately below the aperture AP (that is, at a measurement position upon measuring the focus and shape of a charged particle beam). In such state, by applying the removing processing for removing contaminations CC deposited on the aperture AP, contaminations deposited on the sensor 501 can be removed.

In this embodiment, effects to be described below can be obtained irrespective of whether or not the sensor 501 is located immediately below the aperture AP. For example, when the stage 109 is not located below the aperture AP, since the (volume of the) first space SP1 is large, some active species generated upon reaction of the ethylene gas and ozone gas are diffused in the first space SP1. Therefore, a removing rate of contaminations unwantedly lowers. On the other hand, when the stage 109 is located below the aperture AP, diffusion of active species is suppressed by the stage 109, thus increasing a removing rate of contaminations. In this manner, in this embodiment, the removing rate of contaminations can be increased, a time required to remove contaminations can be shortened, thus improving the throughput of the drawing apparatus 100E.

Also, in this embodiment, the ethylene gas is supplied to the second space SP2, and the ozone gas is supplied to the eighth space SP8. Alternatively, the ozone gas may be supplied to the second space SP2, and the ethylene gas may be supplied to the eighth space SP8.

Sixth Embodiment

Figure 6:
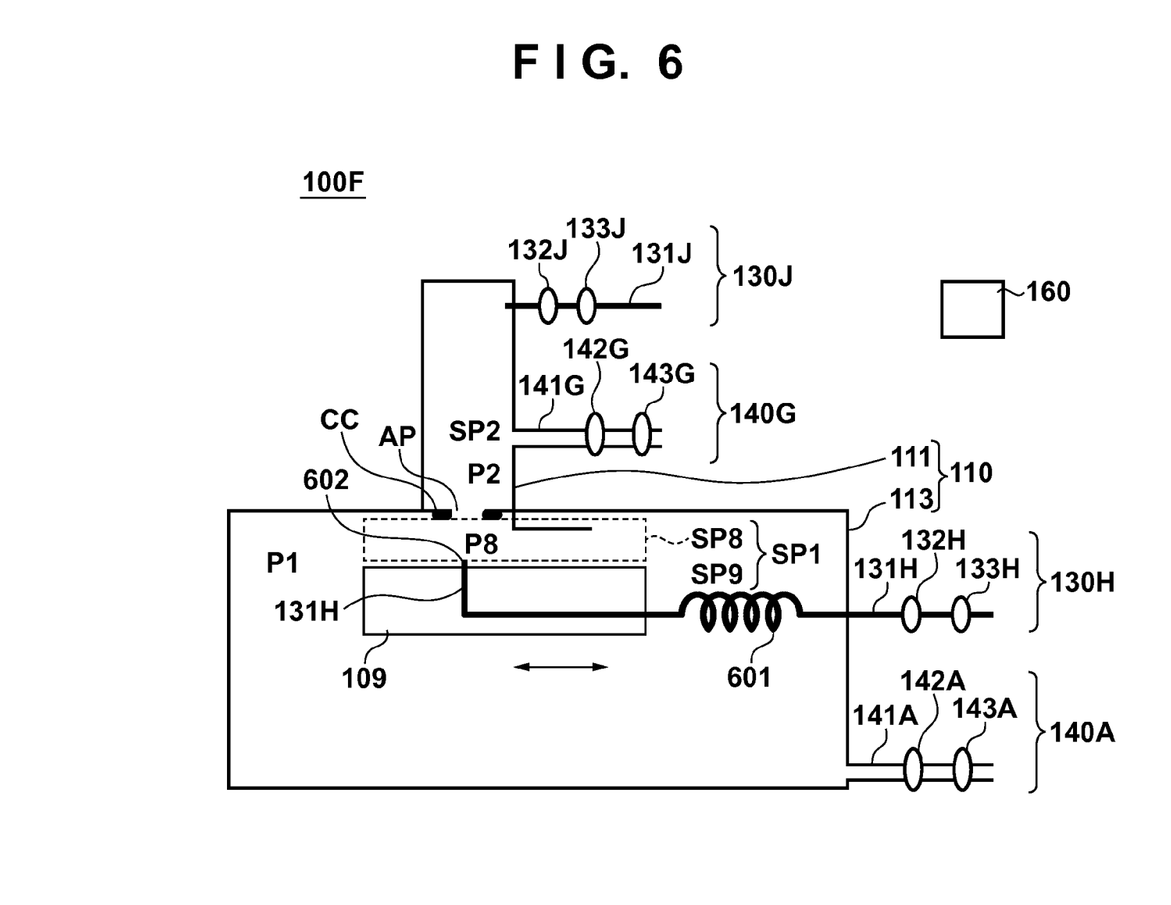
FIG. 6 is a schematic view showing the arrangement of a drawing apparatus according to the sixth embodiment of the present invention.

FIG. 6 is a schematic view showing the arrangement of a drawing apparatus 100F according to the sixth embodiment of the present invention. A drawing apparatus 100F has the same arrangement as the drawing apparatus 100E. In the drawing apparatus 100F, an ozone supply location by an eighth supply unit 130H is different from the drawing apparatus 100E.

A pipe 131H is connected to a stage 109 via a flexible pipe portion 601. The pipe 131H runs inside the stage 109, and is connected to a gas ejection hole 602 formed in the upper surface of the stage 109. Upon removing contaminations CC deposited on an aperture AP, the stage 109 is moved so that the gas ejection hole 602 is located immediately below the aperture AP. In this state, by applying removing processing described in the fifth embodiment, contaminations CC deposited on the aperture AP can be removed. In this embodiment, since the gas ejection hole 602 can be moved to the position immediately below the aperture AP, active species can be generated by reacting an ethylene gas and ozone gas in the vicinity of contaminations CC deposited on the aperture AP. Therefore, contaminations CC deposited on the aperture AP can be removed more efficiently.

Seventh Embodiment

Figure 7:
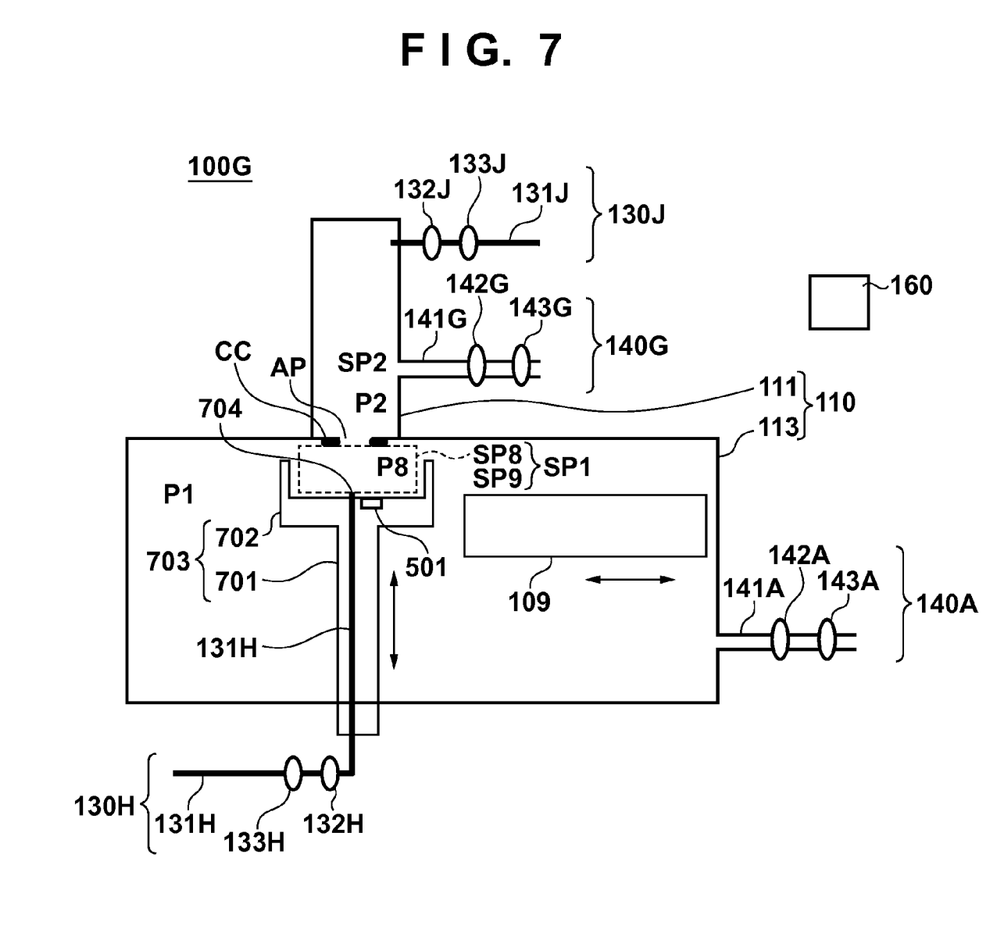
FIG. 7 is a schematic view showing the arrangement of a drawing apparatus according to the seventh embodiment of the present invention.

FIG. 7 is a schematic view showing the arrangement of a drawing apparatus 100G according to the seventh embodiment of the present invention. A drawing apparatus 100G has the same arrangement as the drawing apparatus 100F. In this embodiment, the drawing apparatus 100G includes a movable member 703 as a movable object in addition to a stage 109. The movable member 703 includes a support portion 701 and cup portion 702, and is housed in a stage chamber 113. A pipe 131H extends through the support portion 701 and cup portion 702, and is connected to a gas ejection hole 704 formed in the cup portion 702.

When contaminations CC deposited on an aperture AP are to be removed, the stage 109 is retraced from a position below the aperture AP, and the movable member 703 is located below the aperture AP. In this case, an eighth space SP8 is defined between the cup portion 702 and the (upper surface of the) stage chamber 113. In this state, by applying removing processing described in the fifth embodiment, contaminations CC deposited on the aperture AP can be removed.

Also, a sensor 501 may be disposed on the movable member 703. By disposing the sensor 501 in the vicinity of the gas ejection hole 704 formed in the cup portion 702, contaminations deposited on the sensor 501 can also be removed in addition to contaminations CC deposited on the aperture AP.

In this embodiment, as described in the fifth embodiment, the movable member 703 can suppress diffusion of active species generated upon reaction of an ethylene gas and ozone gas. Also, since the cup portion 702 of the movable member 703 has a concave shape, diffusion of active species can be further suppressed.

In the drawing apparatus 100G, the pipe 131H is connected to the movable member 703 in place of connecting the pipe 131H to the stage 109 which moves at high speed unlike in the drawing apparatus 100F. Since the movable member 703 need only be moved when contaminations are to be removed and when the sensor 501 is used (to measure a focus and shape of a charged particle beam), the durability of the pipe 131H need not be considered, thus reducing cost. Also, since the frequency of pulling and moving the pipe 131H can be reduced, a trouble of the pipe 131H occurs at a lower possibility.

Note that in the first to seventh embodiments, the ozone generator preferably generates ozone at a concentration of 95% or more. However, even when the ozone generator can only generate ozone of several %, the removing effect of contaminations CC can be obtained.

An excessive ethylene gas and ozone gas supplied to the respective spaces, and ketone, aldehyde, alcohol, and the like generated upon reaction of the ethylene gas and ozone gas are burnt (scrubbed) by a scrubber (not shown) and are exhausted as a carbon gas, water, and the like.

The gas containing unsaturated hydrocarbon is not limited to the ethylene gas, but it can be a gas containing double or triple bonds of carbon atoms. The ozone gas acts on such double or triple bonds of carbon atoms to open and decompose the double or triple bonds, thus generating active species. More specifically, the gas containing unsaturated hydrocarbon may be an acetylene gas, propene gas, or butene gas.

As described above, the drawings apparatuses 100A to 100G are suitable for manufacture of an article such as a micro device (for example, a semiconductor device) or an element having a microstructure since they can execute normal drawing processing while suppressing throughput and performance drops. A method of manufacturing an article includes a step of forming a latent image pattern on a photosensitive agent applied to a substrate using the drawing apparatuses 100A to 100G (a step of performing drawing on a substrate), and a step of developing the substrate on which the latent image pattern is formed in the above step (a step of developing the substrate on which the drawing has been performed). Furthermore, this manufacturing method can include other known steps (oxidation, film formation, vapor deposition, doping, planarization, etching, resist removal, dicing, bonding, packaging, etc.) The manufacturing method of an article of this embodiment is advantageous in at least one of performance, quality, productivity, and manufacturing cost of an article compared to a conventional method.

For example, the detailed arrangement of the charged particle optical system is not limited to that described in the first embodiment as long as the arrangement can draw a pattern on a substrate. Also, the ethylene generator can be an ethylene supply source such as an ethylene gas cylinder.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-277440 filed on Dec. 19, 2012, and 2013-197508 filed on Sep. 24, 2013, which are hereby incorporated by reference herein in their entirety.

What is claimed is:

1. A drawing apparatus for performing drawing on a substrate with a charged particle beam, the apparatus comprising:
a first member in which an aperture, through which the charged particle beam passes, is formed;
a chamber including a first space and a second space which are partitioned by the first member; and
a removing device including a first supply device configured to supply a first gas containing unsaturated hydrocarbon to the first space and a second supply device configured to supply a second gas containing ozone to the second space, and configured to remove contamination on the first member by active species generated by reaction of the first gas with the second gas.

2. The apparatus according to claim 1, further comprising:
a regulator configured to regulate a gas pressure in at least one of the first space and the second space; and
a controller configured to control the regulator so as to form a gas pressure difference between the first space and the second space.

3. The apparatus according to claim 2, further comprising a stage disposed in one of the first space and the second space, and configured to hold the substrate and to be moved,
wherein the controller is configured to control the regulator so that a gas pressure in the other of the first space and the second space is higher than that of the one of the first space and the second space.

4. The apparatus according to claim 2, wherein the controller is configured to control the regulator so that the gas pressure difference changes with time.

5. The apparatus according to claim 4, wherein the controller is configured to control the regulator so that a magnitude relation between a gas pressure in the first space and a gas pressure in the second space is inverted with time.

6. The apparatus according to claim 1, wherein the first member includes at least one of an electrode member included in a charged particle optical system, an aperture array member for dividing a charged particle beam into a plurality of charged particle beams, and an aperture member for blanking a charged particle beam.

7. The apparatus according to claim 2, further comprising a charged particle source disposed in one of the first space and the second space, and configured to generate the charged particle beam,
wherein the controller is configured to control the regulator so that a gas pressure in the other of the first space and the second space is higher than that of the one of the first space and the second space.

8. The apparatus according to claim 1, further comprising a second member in which an aperture, through which the charged particle beam passes, is formed,
wherein the first supply device is configured to supply the first gas to the first space via a third space partitioned by the second member.

9. The apparatus according to claim 1, further comprising a second member in which an aperture, through which the charged particle beam passes, is formed,
wherein the second supply device is configured to supply the second gas to the second space via a third space partitioned by the second member.

10. The apparatus according to claim 1, further comprising a second member in which an aperture, through which the charged particle beam passes, is formed,
wherein the removing device includes a supply device configured to supply a third gas containing an inert gas to the first space via a third space partitioned by the second member.

11. The apparatus according to claim 1, further comprising a second member in which an aperture, through which the charged particle beam passes, is formed,
wherein the removing device includes a supply device configured to supply a third gas containing an inert gas to the second space via a third space partitioned by the second member.

12. The apparatus according to claim 1, further comprising a third member disposed in one of the first space and the second space, and configured to divide the one of the first space and the second space into a fourth space, which neighbors the other of the first space and the second space, and a fifth space outside the fourth space,
wherein the removing device includes a supply device configured to supply a gas, corresponding to the one of the first space and the second space, of the first gas and the second gas to the fourth space.

13. The apparatus according to claim 12, wherein the third member is a movable object.

14. The apparatus according to claim 13, wherein the movable object is a stage.

15. The apparatus according to claim 13, wherein the third member includes a sensor configured to measure the charged particle beam.

16. A method of manufacturing an article, the method comprising:
performing drawing on a substrate using a drawing apparatus;
developing the substrate on which the drawing has been performed; and
processing the developed substrate to manufacture the article,
wherein the drawing apparatus performs drawing on the substrate with a charged particle beam, and includes:
a first member in which an aperture, through which the charged particle beam passes, is formed;
a chamber including a first space and a second space which are partitioned by the first member; and
a removing device including a first supply device configured to supply a first gas containing unsaturated hydrocarbon to the first space and a second supply device configured to supply a second gas containing ozone to the second space, and configured to remove contamination on the first member by active species generated by reaction of the first gas with the second gas.

* * * * *